United States Patent
Banerjee et al.

(10) Patent No.: US 6,403,891 B1
(45) Date of Patent: *Jun. 11, 2002

(54) METALLIZATION REMOVAL UNDER THE LASER MARK AREA FOR SUBSTRATES

(75) Inventors: Koushik Banerjee, Chandler; Craig Randleman, Phoenix, both of AZ (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/049,888

(22) Filed: Mar. 27, 1998

(51) Int. Cl.[7] .................................................. H05K 1/00

(52) U.S. Cl. .......................... 174/250; 174/255; 174/261

(58) Field of Search ................................. 174/250, 255, 174/260, 261; 361/748, 792, 795; 257/797

(56) References Cited

U.S. PATENT DOCUMENTS

| 5,093,183 | A | * | 3/1992 | Strunka ....................... 428/195 |
| 5,214,571 | A | * | 5/1993 | Dahlgren et al. ............ 361/414 |
| 5,296,649 | A | * | 3/1994 | Kosuga et al. ............... 174/250 |
| 5,491,302 | A | * | 2/1996 | Distefano et al. ........... 114/260 |
| 5,768,107 | A | * | 6/1998 | Ouchi et al. ................. 361/792 |

\* cited by examiner

Primary Examiner—Kamand Cuneo
(74) Attorney, Agent, or Firm—Blakely, Sokoloff, Taylor & Zafman LLP

(57) ABSTRACT

A printed circuit board which has an ink block and a first conductive layer that are attached to a solder mask. A first dielectric layer is attached to the first conductive layer. Indicia is formed in the ink block by a laser ablation process. The first conductive layer has a first non-metallized area located beneath the ink block. Eliminating metal beneath the ink block would reduce the amount of energy that is absorbed by the circuit board during the laser ablation process. The printed circuit board has multiple layers of conductive and dielectric material. Some or all of the conductive layers may have non-metallized areas located beneath the ink block.

16 Claims, 1 Drawing Sheet

METALLIZATION REMOVAL UNDER THE LASER MARK AREA FOR SUBSTRATES

BACKGROUND OF THE INVENTION

1. FIELD OF THE INVENTION

The present invention relates to a process and structure for forming identification indicia within an ink block of a printed circuit board.

2. BACKGROUND INFORMATION

Integrated circuits are typically assembled within packages that are mounted to a printed circuit board. The printed circuit board may be coupled to a motherboard of a computer system. When manufacturing printed circuit board assemblies it is desirable to provide indicia which identifies the product.

There has been developed a technique for forming an identification matrix in an ink block that is screened onto the top layer of a printed circuit board. The identification matrix is typically scanned by an optical reader to identify the part. The matrix may be formed by removing material from the ink block with laser energy. It has been found that some of the laser energy is transferred into the underlying substrate of the printed circuit board. The circuit board may have internal conductive layers which absorb the heat. The heat may create a delamination of the board. It has been found that a delaminated board or exposed layers on the board creates poor reflectivity on the surface of the board. The poor reflectivity can result in an improper reading of the identification matrix by the optical scanner. It would therefore be desirable to provide a circuit board that does not have a significant reduction in reflectivity when an identification matrix is formed in an ink block with a laser ablation process.

SUMMARY OF THE INVENTION

One embodiment of the present invention is a printed circuit board which has an ink block located adjacent to a first conductive layer. The first conductive layer has a first non-metallized area located beneath the ink block.

DETAILED DESCRIPTION OF THE INVENTION

One embodiment of the present invention is a printed circuit board which has an ink block and a first conductive layer that are attached to a solder mask. In this embodiment a first dielectric layer may be attached to the first conductive layer. Indicia may be formed in the ink block by a laser ablation process. The first conductive layer has a first non-metallized area located beneath the ink block. Eliminating metal beneath the ink block reduces the amount of energy that is absorbed by the circuit board during the laser ablation process. The printed circuit board has multiple layers of conductive and dielectric material. Some or all of the conductive layers may have non-metallized areas located beneath the ink block.

Figure 1:
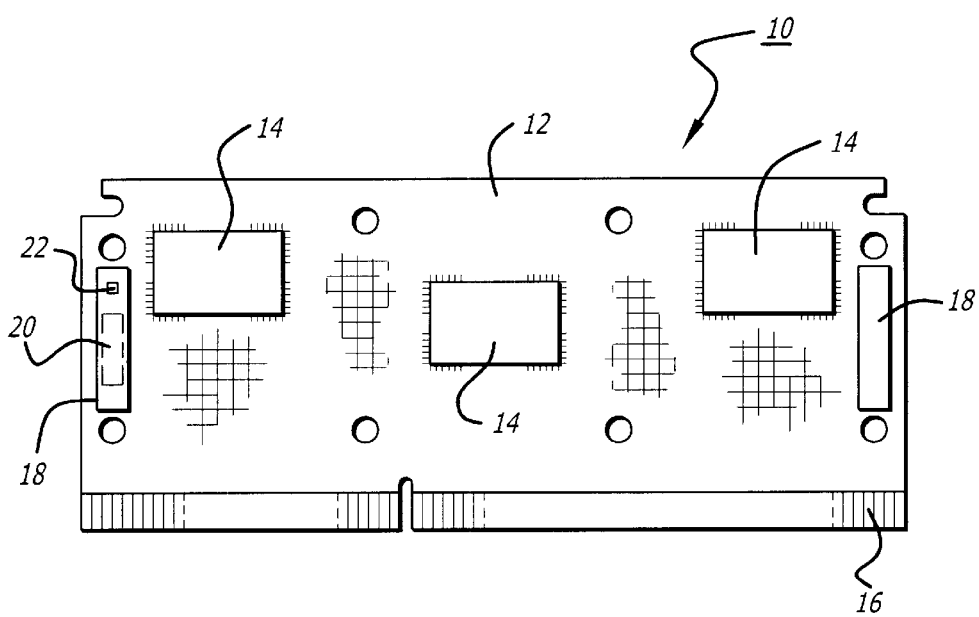
FIG. 1 is a top view of an embodiment of a printed circuit board assembly of the present invention.

Referring to the drawings more particularly by reference numbers, FIG. 1 shows an embodiment of a printed circuit board assembly 10 of the present invention. The assembly 10 includes a printed circuit board 12. The assembly 10 may also include a plurality of integrated circuit packages 14 that are soldered to the board 12. The packages 14 may contain integrated circuits such as microprocessors, memory, etc. One edge of the circuit board 12 may have a plurality of conductive pads 16. The pads 16 may be inserted into an electrical connector (not shown) mounted to a motherboard (not shown) of a computer system.

The printed circuit board 12 may have a pair of ink blocks 18 located along edges of the board 12. One or more of the ink blocks 18 may contain indicia 20 that is machine and/or human readable. The indicia 20 may include an identification matrix mark 22 which can be read by an optical scanner (not shown) to identify the assembly 10.

Figures 2, 3:
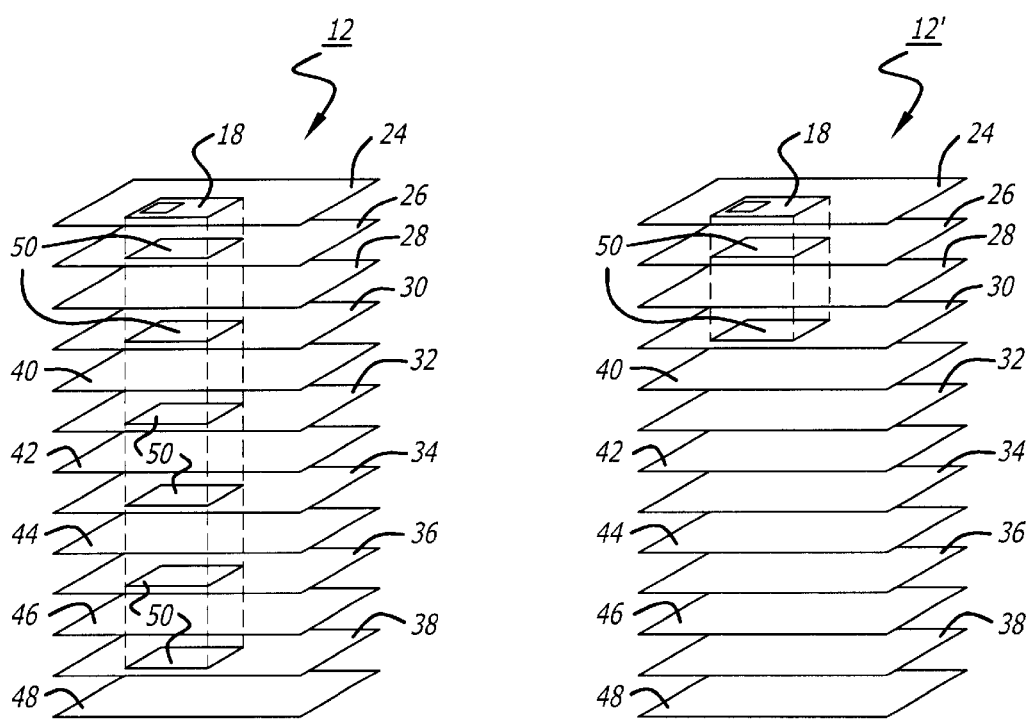
FIG. 2 is an exploded view showing multiple layer of a printed circuit board of the assembly.
FIG. 3 is an exploded view of an alternate embodiment of the circuit board.

FIG. 2 shows an illustrative embodiment of the printed circuit board 12. The circuit board 12 includes first layer of solder mask 24 that is attached to a first conductive layer 26. An ink block 18 is formed on the first layer of solder mask 24. A first dielectric layer 28 is attached to the first conductive layer 26. The circuit board 12 also includes other conductive layers such as a second 30, third 32, fourth 34, fifth 36 and sixth 38 conductive layers attached to second 40, third 42, fourth 44 and fifth 46 dielectric layers, respectively. The circuit board 12 may further have a second layer of solder mask 48 attached to the sixth conductive layer 38.

The conductive layers 26, 30, 32, 34, 36 and 38 are typically patterned layers of metal such as routing traces and power/ground planes. The board 12 may have vias (not shown) that interconnect the various conductive layers. Each conductive layer 26, 30, 32, 34, 36 and 38 includes a non-metallized area 50 that is located beneath the ink block 18. The size of the non-metallized area 50 may be the same as the ink block 18. although the size of the non-metallized area 50 may be slightly greater than or even less than the area occupied by ink block 18. As an alternate embodiment, the non-metallized area 50 may be equal in size to the area allocated for the identification matrix mark 22, and located beneath the matrix mark 22.

The indicia 18, including the identification matrix mark 20, is typically created with a laser ablation process. Creating non-metallized areas 50 below the ink block 18 may reduce the amount of heat absorbed within the circuit board 12 during the laser ablation process. The reduction in heat absorption may also reduce delamination of the circuit board or metal layer exposure during the laser ablation process. The reduction in board delamination may preserve the reflectivity of the indicia.

FIG. 3 shows an alternate embodiment of a printed circuit board 12' wherein only the first 26 and second 30 conductive layers have non-metallized areas 50. It has been found that the laser ablation process will not create a significant reduction in surface reflectivity if the space which separates the ink block 18 and the nearest metal layer is not less than 0.018 inches. Therefore in the embodiment shown in FIG. 3 the distance between the ink block 18 and the third conductive layer 32 is no less than 0.018 inches.

The assembly 10 can be constructed by initially forming and attaching the conductive layers 26, 30, 32, 34, 36 and 38, and dielectric layers 28, 40, 42, 44 and 46 with known printed circuit board processes. The conductive layers are typically etched into patterns. The patterns include the non-metallized areas 50. The layers of solder masks 24 and 48 can then be applied to the first 26 and sixth 38 conductive layers with known processes such as UV curing.

The ink blocks 18 can be formed onto the first layer of solder mask 24. The ink block 18 can be formed onto the solder mask 24 with known silk screening processes. A laser beam (not shown) can be directed onto the ink block(s) 18 to ablate the ink material and create the indicia 20.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A printed circuit board, comprising:
   a solder mask;
   a laser ablated ink block placed only on a first surface of the solder mask;
   a first conductive layer located adjacent a second surface of the solder mask, the first conductive layer having a first non-metallized area aligned with the ink block;
   a first dielectric layer attached to the first conductive layer;
   second conductive layer attached to the first dielectric layer; and
   a second dielectric layer attached to the second conductive layer, the second conductive layer having a second non-metallized area located beneath the ink block.

2. The printed circuit board as recited in claim 1, wherein the ink block includes an identification matrix mark and the first non-metallized area is located beneath the identification matrix mark.

3. The printed circuit board as recited in claim 1, further comprising a third conductive layer attached to the second dielectric layer and a third dielectric layer attached to the third conductive layer.

4. The printed circuit board as recited in claim 3, wherein the third conductive layer is separated from the ink block by a distance that is no less than 0.018 inches.

5. The printed circuit board as recited in claim 3, wherein the third conductive layer has a third non-metallized area located beneath the ink block.

6. The printed circuit board as recited in claim 1, wherein the first conductive layer includes a plurality of conductive pads.

7. The printed circuit board as recited in claim 1, wherein the ink block includes indicia readable by a machine.

8. The printed circuit board as recited in claim 7, wherein the indicia is a laser ablated ink block readable by an optical scanner.

9. The printed circuit board as recited in claim 1, wherein the ink block includes indicia readable by a human.

10. The printed circuit board as recited in claim 1, wherein the first non-metallized area is generally equal in size to an area occupied by the ink block.

11. A printed circuit board comprising:
    a solder mask;
    a laser ablated ink block formed only on a top surface of the solder mask;
    a first conductive layer in contact with a bottom surface of the solder mask, the first conductive layer including a first non-metallized, laminated area located directly beneath the laser ablated ink block;
    a first dielectric layer attached to the first conductive layer;
    a second conductive layer attached to the first dielectric layer; and
    a second dielectric layer attached to the second conductive layer, the second conductive layer having a second non-metallized area located directly beneath the ink block.

12. The printed circuit board as recited in claim 11, further comprising a third conductive layer attached to the second dielectric layer, and a third dielectric layer attached to the third conductive layer, the third conductive layer having a third non-metallized area located directly beneath the ink block.

13. The printed circuit board as recited in claim 12, further comprising a third conductive layer attached to the second dielectric layer, the third conductive layer is separated from the ink block by a distance that is no less than 0.018 inches.

14. The printed circuit board as recited in claim 11, wherein the ink block includes indicia readable by a human.

15. The printed circuit board as recited in claim 11, wherein the ink block includes indicia readable by a machine.

16. The printed circuit board as recited in claim 15, wherein the indicia is a laser ablated ink block readable by an optical scanner.

* * * * *